United States Patent
Maki

(10) Patent No.: US 7,678,197 B2
(45) Date of Patent: Mar. 16, 2010

(54) SUSCEPTOR DEVICE

(75) Inventor: Keigo Maki, Narashino (JP)

(73) Assignee: Sumitomo Osaka Cement Co., Ltd. (JP)

( * ) Notice: Subject to any disclaimer, the term of this patent is extended or adjusted under 35 U.S.C. 154(b) by 0 days.

(21) Appl. No.: 10/633,928

(22) Filed: Aug. 4, 2003

(65) Prior Publication Data

US 2005/0098120 A1    May 12, 2005

(30) Foreign Application Priority Data

Aug. 9, 2002    (JP)    ............ P 2002-234078

(51) Int. Cl.
*C23C 16/00*    (2006.01)
*H01L 21/68*    (2006.01)

(52) U.S. Cl. .............. 118/724; 118/725; 118/728; 156/345.52; 156/345.53

(58) Field of Classification Search ............. 118/723 E, 118/723 ME, 724, 725, 728; 156/345.52, 156/345.53, 345.37, 345.43–345.47; 361/234; 279/128

See application file for complete search history.

(56) References Cited

U.S. PATENT DOCUMENTS

| | | | | |
|---|---|---|---|---|
| 5,275,683 A * | 1/1994 | Arami et al. | ............ | 156/345.51 |
| 5,775,416 A * | 7/1998 | Heimanson et al. | ......... | 165/275 |
| 5,892,207 A * | 4/1999 | Kawamura et al. | .......... | 219/492 |
| 6,012,509 A * | 1/2000 | Nonaka | ...................... | 165/80.2 |
| 6,677,167 B2 * | 1/2004 | Kanno et al. | .................. | 438/14 |
| 6,689,984 B2 * | 2/2004 | Maki | ..................... | 219/121.43 |
| 6,771,483 B2 * | 8/2004 | Harada et al. | ............... | 361/234 |
| 2003/0106647 A1 * | 6/2003 | Koshiishi et al. | ....... | 156/345.53 |

FOREIGN PATENT DOCUMENTS

| | | |
|---|---|---|
| JP | 8162519 | 6/1996 |
| JP | 9045757 | 2/1997 |
| JP | 10032239 | 2/1998 |
| JP | 10-144778 | 5/1998 |
| JP | 10-150100 | 6/1998 |
| JP | 10270540 | 10/1998 |
| JP | 2001-7189 | 1/2001 |
| JP | 2001-308165 | 11/2001 |
| JP | 2001313331 | 11/2001 |
| JP | 2002184851 | 6/2002 |

OTHER PUBLICATIONS

Computer Generated English Translation of JP200131331, Sep. 11, 2001.*
Japanese Office Action. English translation of Japanese Office Action. 3 pages each.

* cited by examiner

*Primary Examiner*—Sylvia R. MacArthur
(74) *Attorney, Agent, or Firm*—Ostrolenk Faber LLP

(57) ABSTRACT

A susceptor device comprises a base body, an electrostatic absorbing inner electrode which is disposed on a bottom surface of the base body, a power supplying terminal, an insulating sprayed layer which coats the electrostatic absorbing inner electrode and a connecting section for the power supplying terminal and the electrostatic absorbing inner electrode, and a temperature controlling section. The insulating sprayed layer and the temperature controlling section are attached together unitarily via the bonding agent layer. The flange of the base body fits to a notched section of the temperature controlling section such that the electrostatic absorbing inner electrode, insulating sprayed layer, and the bonding agent layer should be sealed from thereoutside. It is possible to form a thin supporting plate and improve controllability for temperature on the plate sample and transparency for the plasma.

7 Claims, 2 Drawing Sheets

PRIOR ART

US 7,678,197 B2

SUSCEPTOR DEVICE

Priority is claimed on Japanese Patent Application No. 2002-234078, filed Aug. 9, 2002, the content of which is incorporated herein by reference.

BACKGROUND OF THE INVENTION

1. Field of the Invention

The present invention relates to a susceptor device which is used for fixing a plate sample such as a silicon wafer preferably in a semiconductor manufacturing device for manufacturing a semiconductor device such as an IC (Integrated Circuit), an LSI (Large Scale Integration), and a VLSI (Very Large-Scale Integration). In particular, the present invention relates to a susceptor device which fixes the plate sample by an electrostatic force while supporting the plate sample efficiently in a constant temperature so as to perform various operations such as a plasma-operation.

2. Description of Related Art

Conventionally, in manufacturing processes for manufacturing a semiconductor device such as an IC, an LSI, and a VLSI, the plate sample such as a silicon wafer is fixed on a sample mount which is called a susceptor body such that predetermined operations may be performed thereto.

For example, operations such as an etching operation are performed to the plate sample under a plasma atmosphere condition, temperature on a surface of the plate sample increase due to a heat which is caused in the plasma; thus, there may be a problem that a resist layer on the surface thereon may burst. For dealing with such a problem, a susceptor device has been proposed in which a temperature controlling section having a flow path for a medium for controlling the temperature of the medium thereinside is attached unitarily to a bottom surface of a susceptor base body on which the plate sample is fixed. A cooling medium is circulated in the flow path in the temperature controlling section so as to exchange a heat therein. Consequently, the plate sample is absorbed by an electrostatic force while the temperature of the plate sample is maintained at a preferable constant temperature such that various plasma operations may be performed to the plate sample.

FIG. 3 is a cross section for showing an example for such a susceptor device. Here, a susceptor device 1 comprises a ceramic mounting plate 2 of which upper surface 2a serves for mounting a plate sample thereon, a ceramic supporting plate 3 for supporting the mounting plate 2 from therebeneath, an electrostatic absorbing inner electrode 4 and a ring insulating member 5 which are disposed between the mounting plate 2 and the supporting plate 3, an electricity supplying terminal 7 which is disposed in a fixing hole 6 formed on the supporting plate 3 so as to contact the electrostatic absorbing inner electrode 4, and a temperature controlling section 8 which is disposed beneath the supporting plate 3 and has a flow path 8a thereinside for circulating a cooling medium. Here, the supporting plate 3 and the temperature controlling section 8 are attached unitarily via a bonding agent layer 9 which is formed by a bonding agent which contains a soft brazing member such as an Indium (In) or an Indium alloy. Also, an outer periphery of the electricity supplying terminal 7 is surrounded by an insulating member 10. The electricity supplying terminal 7 is connected to an external direct current power supply 11. A body of the temperature controlling section 8 is formed by a conductive member so as to serve as an inner electrode for generating a plasma compatibly so as to be connected to an external high frequency power supply 12.

However, in the conventional susceptor device 1 as explained above, thickness of a ceramic supporting plate 3 is at least 3 mm; therefore, a heat is not sufficiently efficiently exchanged between the plate sample and the temperature controlling section 8. Thus, there has been a problem in that it is difficult to maintain the plate sample at a constant preferable temperature. Thus, it has been desired that an operability for controlling the temperature in the conventional susceptor device 1 be improved further.

Also, in the susceptor device 1, the thickness of the supporting plate 3 is at least 3 mm; therefore, there has been a problem in that it is difficult to generate a plasma stably because there is not a sufficient transparency for the plasma.

Also, in the susceptor device 1, there has been a concern that a heavy metal component in a bonding agent layer 9 may be volatile because the bonding agent layer 9 is not durable enough to a corrosive gas and a plasma. Therefore, such a volatile heavy metal component may cause a contamination on the plate sample or become a source for generating a particle.

Furthermore, the bonding agent layer 9 is a conductive member; therefore, there has been a concern that there may occur an abnormal electric discharge on the bonding agent layer 9 when the bonding agent layer 9 is exposed to a plasma; thus there may occur a dielectric breakdown on the bonded surface. Therefore, there has been a problem in that the susceptor device 1 does not work stably due to a frequent interruption by a safety device and a susceptor device 1 is not durable enough even if the susceptor device 1 works stably.

SUMMARY OF THE INVENTION

The present invention was made so as to solve the above problems. An object of the present invention is to provide a susceptor device which can realize a thinner supporting plate and improved operability for controlling the temperature of the plate sample and improved transparency for the plasma by replacing the plate sample. Furthermore, an additional object of the present invention is to provide a susceptor device in which there is not a concern for a contamination such as a particle on the plate sample and an abnormal electric discharge; thus stable operability and durability can be improved.

After an elaborate research and development, the inventor of the present invention found a fact that it is possible to solve the above problems effectively by spraying a ceramic coating member on the inner electrode which is disposed on the ceramic base body so as to form an insulating sprayed layer on the inner electrode and attaching the base body and the temperature controlling section via the insulating sprayed layer; thus, the inventor of the present invention completed the present invention.

That is, a susceptor device of the present invention comprises a ceramic base body of which main surface serves for mounting a plate sample thereon, an inner electrode which is disposed on other main surface of the ceramic base body, an electricity supplying terminal which is connected to the inner electrode electrically, an insulating sprayed layer which covers the inner electrode, and a connecting section of the inner electrode and the electricity supplying terminal, and a temperature controlling section which is disposed beneath the insulating sprayed layer and has a flow path inside of the temperature controlling section for circulating a medium for controlling the temperature of the medium, In this aspect of the present invention, it is characterized in that the insulating sprayed layer and the temperature controlling section are attached via a bonding agent layer, and the base body and the temperature controlling section are formed unitarily.

In this susceptor device, an insulating sprayed layer is formed so as to coat the inner electrode and a connecting section for the inner electrode and the electricity supplying terminal. Furthermore, the insulating sprayed layer and the temperature controlling section are attached together via the bonding agent layer; thus, the base body and the temperature controlling section are attached unitarily. Therefore, it is possible to replace the conventional supporting plate by a thin insulating sprayed layer; thus, the thermal conductivity and the transparency for the plasma are improved between the temperature controlling section and the plate sample.

It is preferable that the thickness of the insulating sprayed layer should be in a range of 20 µm to 500 µm.

Here, it is indicated that the thickness of the insulating sprayed layer may be an average thickness of the insulating sprayed layer with reference to a surface of the base body.

It is preferable that the thickness of the inner electrode is in a range of 5 µm to 200 µm.

If the inner electrode is formed as thin as the thickness of in a range of 5 µm to 200 µm, it is possible to form a thinner insulating sprayed layer; thus, thermal conductivity and the transparency for the plasma are improved between the temperature controlling section and the plate sample.

Furthermore, it is preferable that a convex fitting section is disposed on a peripheral section on either one of the base body or the temperature controlling section, a concave fitting section is disposed on a peripheral section on the base body under condition that the base body does not have the convex fitting section or on a peripheral section on the temperature controlling section under condition that the temperature controlling section does not have the convex fitting section, the convex fitting section and the concave fitting section are fitted together, and the insulating sprayed layer and the bonding agent layer are sealed from thereoutside. By doing this, it is possible to protect the inner electrode, the insulating sprayed layer, and the bonding agent layer from the corrosive gas and the plasma.

EFFECT OF THE PRESENT INVENTION

As explained above, in the susceptor device according to the present invention, an insulating sprayed layer which coats the inner electrode, a connecting section of the inner electrode and the electricity supplying terminal, and a temperature controlling section are attached via the bonding agent layer; therefore, it is possible to replace the supporting plate in the conventional susceptor device by a thinner insulating sprayed layer. Also, it is possible to reduce an interval between the temperature controlling section and the plate sample; thus, thermal conductivity and the transparency for the plasma are improved between the temperature controlling section and the plate sample.

Also, a convex fitting section is disposed on a peripheral section on either one of the base body or the temperature controlling section, a concave fitting section is disposed on a peripheral section on the base body under condition that the base body does not have the convex fitting section or on a peripheral section on the temperature controlling section under condition that the temperature controlling section does not have the convex fitting section, the convex fitting section and the concave fitting section are fitted together, and the insulating sprayed layer and the bonding agent layer are sealed from thereoutside. By doing this, it is possible to protect the inner electrode, the insulating sprayed layer, and the bonding agent layer from the corrosive gas and the plasma; thus, there is not a concern that a contamination such as a particle may occur on the plate sample.

Furthermore, the operation in the susceptor device is not interrupted a safety device frequently when the bonding agent layer is exposed to the plasma and an abnormal electric discharge occurs. Thus, it is possible to realize a susceptor device in which operability is stable and the durability is superior.

DETAILED DESCRIPTION OF THE INVENTION

Embodiments of the susceptor device according to the present invention are explained as follows.

Here, following embodiments are explained for better understanding of the present invention; thus, it should be understood that the present invention not be limited unless otherwise specified.

First Embodiment

Figure 1:
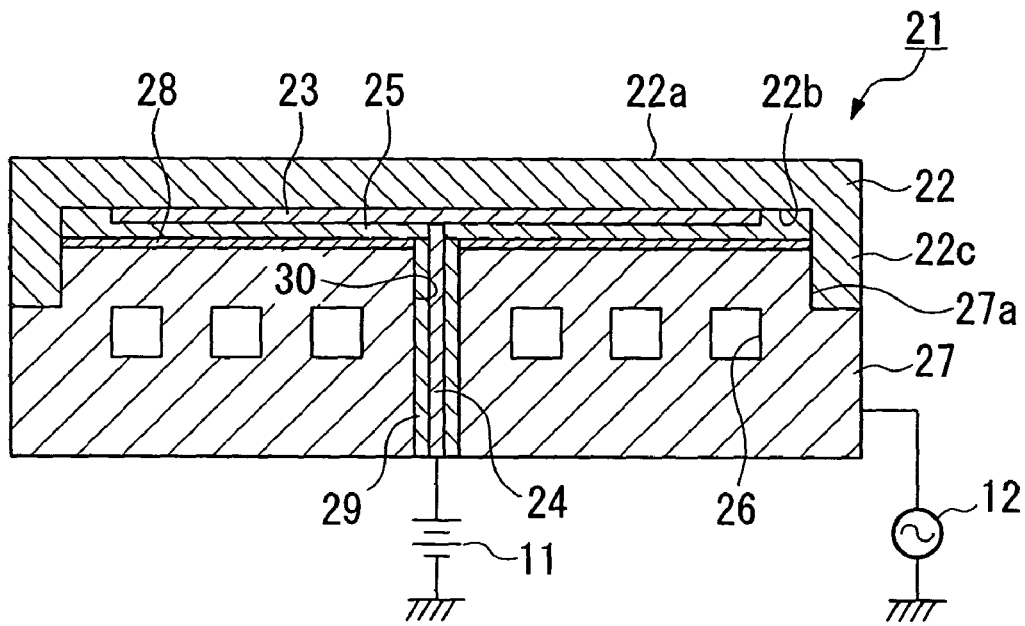
FIG. 1 is a cross section for showing a first embodiment of the susceptor according to the present invention.

FIG. 1 is a cross section for showing a susceptor device according to a first embodiment of the present invention.

A susceptor device 21 comprises a base body 22 which is formed by a ceramic plate of which upper surface (a main surface) serves as a mounting surface 22a for mounting a plate sample such as a silicon wafer, an electrostatic absorbing inner electrode 23 having a predetermined pattern which is disposed on a bottom surface (other main surface) 22b of the base body 22, a power supplying terminal 24 one of which end section is connected to the electrostatic absorbing inner electrode 23 and another one of which end section is exposed to thereoutside, an insulating sprayed layer 25 which is fixed on the bottom surface 22b of the base body 22 so as to coat an entire surface of the electrostatic absorbing inner electrode 23 and a connecting section for the power supplying terminal 24 and the electrostatic absorbing inner electrode 23, and a temperature controlling section 27 which is disposed beneath the insulating sprayed layer 25 and has a flow path 26 inside a thick plate body of the temperature controlling section 27 through which a cooling medium (temperature controlling medium) such as a water or a gas circulates.

The insulating sprayed layer 25 and the temperature controlling section 27 are attached together unitarily via the bonding agent layer 28. Also, the outer periphery of the power supplying terminal 24 is surrounded by an insulating member 29 so as to be fixed to a through-hole 30 which is formed on the temperature controlling section 27 such that the power supplying terminal 24 should be further connected to the direct current power supply 11 which is disposed thereoutside. Also, a body of the temperature controlling section 27 is formed by a conductive member so as to serve as an inner electrode for generating a plasma compatibly so as to be connected to an external high frequency power supply 12.

Also, a ring flange 22c is disposed around a peripheral section of the base body 22 so as to protrude toward the temperature controlling section 27. Additionally, a notched section 27a having a fitting shape for the ring flange 22c is formed around an upper periphery of the temperature controlling section 27. Consequently, the electrostatic absorbing inner electrode 23, the insulating sprayed layer 25, and the bonding agent layer 28 are surrounded by the temperature controlling section 27 so as to be sealed from thereoutside by fitting the ring flange 22c of the base body 22 to the notched section 27a of the temperature controlling section 27; thus, the electrostatic absorbing inner electrode 23, the insulating sprayed layer 25, and the bonding agent layer 28 are not exposed to the corrosive gas and the plasma.

For a member for forming the above base body 22, it is preferable to use a ceramic member which contains at least one of members among aluminum nitride, aluminum oxide, silicon nitride, silicon oxide, zirconium oxide, titanium oxide, Sialon, boron nitride, and silicon carbide. Thus, it may be acceptable if the member for forming the base body 22 is formed by one member or a composite member which contains plural members. More importantly, it should be understood that a coefficient of thermal expansion of the member for forming the base body 22 should preferably be as close as possible to a coefficient of thermal expansion in the electrostatic absorbing inner electrode 23 and the coefficient of thermal expansion of the insulating sprayed layer 25. Also, it is preferable that the member for forming the base body 22 should be sintered easily and the sintered member has a dense structure and sufficient mechanical strength.

Also, the mounting surface 22a of the base body 22 is supposed to serve as an electrostatic absorbing surface; therefore, it is preferable to select a member having a high dielectric constant which will not form an impurity to the plate sample which is absorbed electrostatically.

The thickness of the base member 22 should preferably be in a range of 0.3 mm to 3 mm. More preferably, the thickness of the base member 22 should be in a range of 0.54 mm to 1.5 mm. The reason is as follows. If the thickness of the base body 22 is fewer than 0.3 mm, it is not possible to realize a sufficient voltage durability. On the other hand, if the thickness of the base body 22 is greater than 3 mm, the electrostatic absorbing force decreases. In addition, a thermal conductivity between the plate sample which is mounted on the mounting surface 22a of the base body 22 and the temperature controlling section 27 decreases; thus, it is difficult to maintain temperature of the plate sample at a preferable constant temperature under processing operation.

For a member for forming such a electrostatic absorbing inner electrode 23, it is possible to use a high-boiling-point metal member such as titanium, tungsten, molybdenum, and a platinum, a carbon member such as a graphite and a carbon, and a conductive ceramics member such as silicon carbide, titanium nitride, and titanium carbide.

More importantly, it should be understood that a coefficient of thermal expansion of the member for forming the electrode should preferably be as close as possible to a coefficient of thermal expansion in the base body 22 and the coefficient of thermal expansion in the insulating sprayed layer 25.

The thickness of the electrostatic absorbing inner electrode 23 should preferably be in a range of 5 µm to 200 µm. More preferably, the thickness of the electrostatic absorbing inner electrode 23 should preferably be in a range of 10 µm to 100 µm. The reason is as follows. If the thickness of the electrostatic absorbing inner electrode 23 is fewer than 5 µm, it is not possible to realize a sufficient conductivity. On the other hand, if the thickness of the electrostatic absorbing inner electrode 23 is greater than 200 µm, there is a concern that the sprayed member for forming an insulating sprayed layer may be removed thereoff. Also, the thermal conductivity between the plate sample which is mounted on the base body 22 and the temperature controlling section 27 decreases; thus, it is difficult to maintain the temperature of the plate sample under processing operations at a preferable constant temperature. Also, the transparency for the plasma decreases; thus, the plasma is generated unstably.

The electrostatic absorbing inner electrode 23 having above thickness can be formed easily by employing a sputtering method, a vapor deposition method, or a printing method which have been known commonly.

The power supplying terminal 24 charges an electrostatic voltage to the electrostatic absorbing inner electrode 23. Quantity and shape of the power supplying terminal 24 depend on the condition of the electrostatic absorbing inner electrode 23. That is, quantity and shape of the power supplying terminal 24 depend on whether the electrostatic absorbing inner electrode 23 is a mono-polar electrode or a bi-polar electrode.

A member for forming the power supplying terminal 24 is not limited as long as it is a conductive member having a superior heat resistance. More importantly, it is preferable that the coefficient of thermal expansion in the power supplying terminal 24 should be as close as possible to the coefficient of thermal expansion in the electrostatic absorbing inner electrode 23 and the coefficient of thermal expansion in the base body 22. For example, it is preferable to use Kovar alloy, metal member such as niobium (Nb), and various conductive ceramics members.

A member for forming the insulating sprayed layer 25 is not limited as long as it has a superior heat resistance and insulation. More importantly, it is preferable that the coefficient of thermal expansion in the insulating sprayed layer 25 should be as close as possible to the coefficient of thermal expansion in the electrostatic absorbing inner electrode 23 and the coefficient of thermal expansion in the base body 22. For example, it is preferable to use ceramic member such as alumina, silicon dioxide, silicon nitride, and silicon carbide.

For spraying the insulating sprayed layer 25, for example, it is possible to employ a commonly known spraying method such as a plasma-jet spray method. In the plasma-jet method, a plasma of orifice gas is made by an arc flare which is generated between a cathode and an anode nozzle such that a sprayed member is fed into the plasma so as to be sprayed on a surface on which the sprayed member is supposed to be emitted. The sprayed layer which is made by the above method has a porous layered structure. The insulating sprayed layer 25 is surrounded by the base body and the temperature controlling section 27; therefore, it is not necessary to seal nor melt the insulating sprayed layer 25.

The thickness of the insulating sprayed layer 25 should preferably be in a range of 20 µm to 500 µm. More preferably, the thickness of the insulating sprayed layer 25 should be in a range of 50 µm to 300 µm. The reason is as follows. If the thickness of the insulating sprayed layer 25 is fewer than 20 µm, insulation and voltage durability decrease. For example, in a case of a bi-polar electrostatic chuck, an electricity leaks between the anode and the cathode. On the other hand, if the thickness of the insulating sprayed layer 25 is greater than 500 µm, it is not economically advantageous. In addition, a thermal conductivity between the plate sample which is mounted on the mounting surface 22a of the base body 22 and the temperature controlling section 27 decreases; thus, it is difficult to maintain temperature of the plate sample at a preferable constant temperature under processing operation. Furthermore, the transparency for the plasma decreases; thus, the plasma is generated unstably.

The insulating sprayed layer 25 is surrounded by the base body 22 and the temperature controlling section 27; therefore, anti-plasma characteristics is not necessary in the insulating sprayed layer 25.

A member for forming the temperature controlling section 27 is not limited to a particular member as long as it has superior thermal conductivity, electric conductivity, and formability. For example, it is preferable to use a metal member such as copper, aluminum, titanium, and stainless steel member, and a conductive composite member which contains a metal such as aluminum and conductive ceramics member. For example, for such a conductive composite member, an aluminum composite member which is made by dispersing 20 to 70 weight % of silicon carbide in aluminum member can be preferably used.

The entire surface of the temperature controlling section 27 or at least the surface which is exposed to the plasma should preferably be coated by an alumite or a polyimide resin. By coating the surface by alumite or polyimide resin, anti-plasma characteristics in the temperature controlling section 27 can be improved. Also, an abnormal electric discharge is prevented; thus, stability for anti-plasma characteristics is improved. Also, it is possible to prevent a flaw on the surface.

The temperature controlling section 27 can control the temperature in the plate sample under processing operations so as to be maintained at a preferable constant temperature by circulating a cooling medium such as water or helium (He) gas in the flow path 27a.

A member (a bonding agent or a cementing agent) for forming the bonding agent layer 28 is not limited to a specific member as long as it can attach the insulating sprayed layer 25 and the temperature controlling section 27 tightly. For example, it is preferable to use a flexible organic cementing agent such as a silicon bonding agent and a fluorine resin bonding agent, and a soft brazing member which contains indium or indium alloy.

The above insulating sprayed layer 25 is not a flexible member; therefore, it is difficult to attach (cement) the insulating sprayed layer 25 and the temperature controlling section 27 tightly by a non-flexible bonding agent or a hard brazing member. A flexible bonding agent and a soft brazing member are flexible members; therefore, these layers work for alleviating the thermal expansion preferably. Thus, the bonding agent layer 28 is not deteriorated by a thermal stress. The thickness of the bonding agent layer 28 is not limited to a specific values. More importantly, it is preferable that the thickness of the bonding agent layer 28 be in a range of 150 µm to 250 µm. The reason is as follows. If the thickness of the bonding agent layer 28 is fewer than 150 µm, it is not possible to realize a sufficient strength in the bonded section. On the other hand, if the thickness of the bonding agent layer 28 is greater than 250 µm, efficiency for themal exchanging operation and transparency for the plasma may decrease.

As explained above, in the susceptor device according to the present invention, the electrostatic absorbing inner electrode 23 and the connecting section for the electrostatic absorbing inner electrode 23 and the power supplying terminal 24 are coated by the thin insulating sprayed layer 25. Also, the insulating sprayed layer 25 and the temperature controlling section 27 are attached together via the bonding agent layer 28; thus, the base body 22 and the temperature controlling section 27 are attached unitarily. Therefore, it is possible to replace the conventional thick supporting plate by the thin insulating sprayed layer 25; thus, it is possible to narrow an interval between the temperature controlling section 27 and the plate sample. By doing this, it is possible to improve a controllability for the temperature in the plate sample. Therefore, it is possible to improve the thermal conductivity between the temperature controlling section 27 and the plate sample and the transparency for the plasma.

Also, the ring flange 22c is disposed around a peripheral section of the base body 22. Additionally, a notched section 27a having a fitting shape for the ring flange 22c is formed around an upper periphery of the temperature controlling section 27. Consequently, the electrostatic absorbing inner electrode 23, the insulating sprayed layer 25, and the bonding agent layer 28 are surrounded by the base body 22 and the temperature controlling section 27 so as to be sealed from thereoutside by fitting the ring flange 22c of the base body 22 to the notched section 27a of the temperature controlling section 27; thus, it is possible to protect the electrostatic absorbing inner electrode 23, insulating sprayed layer 25, and the bonding agent layer 28 from the corrosive gas or the plasma. Therefore, it is possible to prevent an occurrence of an abnormal electric discharge, stabilize the operations in the susceptor device, and improve the durability of the susceptor device.

Second Embodiment

Figure 2:
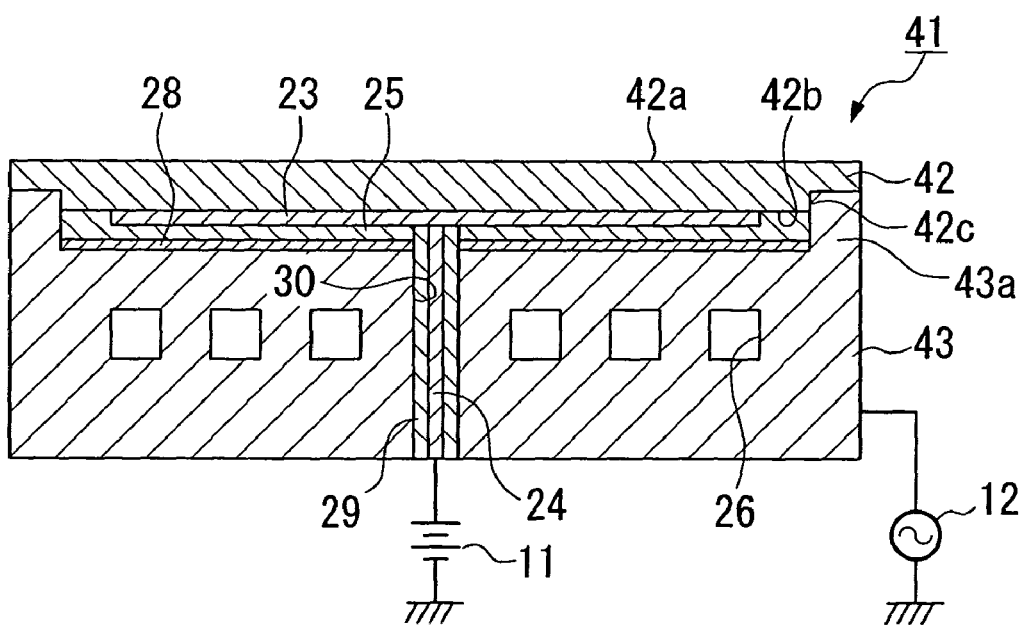
FIG. 2 is a cross section for showing a second embodiment of the susceptor according to the present invention.

FIG. 2 is a cross section for the susceptor device according to a second embodiment of the present invention. A susceptor device 41 according to the second embodiment is different from the susceptor device 21 according to the first embodiment in following features. That is, in the susceptor device 21 in the first embodiment, a ring flange 22c is disposed around a peripheral section of the base body 22. Additionally, a notched section 27a having a fitting shape for the ring flange 22c is formed around an upper periphery of the temperature controlling section 27. In contrast, in the susceptor device 41 in the present embodiment, a notched section 42c is formed around a lower periphery of a base body 42. Additionally, a ring flange 43a having a fitting shape for the notched section 42c is disposed around an upper peripheral section of a temperature controlling section 43 such that the ring flange 43a on the temperature controlling section 43 is fitted to the notched section 42c of the base body 42.

Similarly to the susceptor device 21 according to the first embodiment, in the susceptor device 41, an upper surface of the base body 42 serves as a mounting surface 42a for mounting a plate sample thereon, the electrostatic absorbing inner electrode 23 is disposed in a predetermined pattern on a bottom surface 42b of the base body 42. An end section of the power supplying terminal 24 is connected to the electrostatic absorbing inner electrode 23. An entire surface of the electrostatic absorbing inner electrode 23 and a connecting section for the power supplying terminal 24 and the electrostatic absorbing inner electrode 23 are coated by the insulating sprayed layer 25. The insulating sprayed layer 25 and an upper surface of the temperature controlling section 43 are attached together unitarily via the bonding agent layer 28.

Here, the rest of the features such as a member for forming the base body 42, a member for forming the temperature controlling section 43, and other aspects in the second embodiment are the same as those in the susceptor device 21 according to the first embodiment; thus, explanations for these features are omitted.

Similarly to a case of the susceptor device 21, the electrostatic absorbing inner electrode 23, the insulating sprayed layer 25, and the bonding agent layer 28 are surrounded by the temperature controlling section 43 so as to be sealed from thereoutside in the susceptor device 41; thus, the electrostatic absorbing inner electrode 23, the insulating sprayed layer 25, and the bonding agent layer 28 are not exposed to the corrosive gas and the plasma.

Similarly to a case of the susceptor device 21 according to the first embodiment, it is possible to improve the thermal conductivity between the temperature controlling section 43 and the plate sample and the transparency for the plasma in the susceptor device 41 in the present embodiment.

Also, it is possible to protect the electrostatic absorbing inner electrode 23, the insulating sprayed layer 25, and the bonding agent layer 28 from the corrosive gas and the plasma; therefore, it is possible to prevent an occurrence of an abnormal electricity discharge, stabilize operations in the susceptor device 41, and improve the durability of the susceptor device 41.

EXAMPLE

Here, examples are explained for explaining details for the present invention as follows.

Here, the susceptor device 21 which is shown in FIG. 1 is produced.

Manufacturing a Base Body

A mixture of 5 weight % of silicon carbide powder and aluminum oxide powder for the rest of the weight % is formed in to an approximate round plate. After that, the approximate round plate is sintered at a predetermined temperature; thus, an approximate round plate made of silicon carbide-aluminum oxide (alumina) sintered-composite is formed having 230 mm diameter and 1 mm thickness. Consequently, an upper surface (a main surface) of the sintered-composite is ground such that a flatness of the upper surface should be fewer than 10 μm so as to form a mounting surface on which the plate sample is supposed to be mounted. Thus, a ceramic base body 22 is formed.

Forming an Electrostatic Absorbing Inner Electrode

A mixture of 74.3 weight % of silver (Ag) powder, 21.0 weight % of copper (Cu) powder, and 4.7 weight % of titanium (Ti) powder, an organic solvent, and a member which contains an organic binder so as to be sprayed are applied on a bottom surface (other main surface) 22b of the ceramic base body 22 by screen-printing method such that the mixture of the above powders should form an electrostatic absorbing inner electrode in a thermal processing operation which is supposed to be performed later. After that, the mixture of the above powders are dried at a predetermined temperature; thus, a layer for forming an electrostatic absorbing inner electrode is formed.

Next, a bar member made of Kovar alloy having 10 mm diameter and 20 mm length is disposed at a predetermined position on the layer for forming an electrostatic absorbing inner electrode vertically. Thermal treatment is performed for the bar member at 780° C. under a vacuum condition; thus, electrostatic absorbing inner electrode 23 having 50 μm to which the power supplying terminal 24 is connected is formed.

Forming an Insulating Sprayed Layer

An insulating sprayed layer 25 is formed so as to coat an entire surface of the electrostatic absorbing inner electrode 23 and a connecting section for the power supplying terminal 24 and the electrostatic absorbing inner electrode 23 by a plasma-jet spraying method.

For a member which is supposed to be sprayed, an aluminum oxide powder is used (average grain diameter 2 μm) which is commercially obtained; thus, an insulating sprayed layer having average thickness 200 μm is formed.

Producing a Temperature Controlling Section

A temperature controlling section 27 in approximate round shape having 230 mm diameter and 30 mm thickness is formed by aluminum which contains 15 weight % of silicon carbide by casting method.

A flow path 26 through which a cooling medium is circulated and a through hole 30 through which the power supplying terminal 24 is disposed are formed in the temperature controlling section 27.

Attaching Together Unitarily

An upper surface of the temperature controlling section 27 is degreased and cleaned by using an acetone. Indium brazing member which contains indium (In) as a main component is applied on the upper surface. Thermal treatment is performed to the upper surface of the temperature controlling section 27 in an atmosphere at 200° C.; thus, a brazing member layer having 200 μm thickness is formed. Here, the brazing member layer is formed except on the through hole 30 through which the power supplying terminal 24 is supposed to be disposed.

After that, the base body 22 on which the electrostatic absorbing inner electrode 23 is formed is mounted on the upper surface of the temperature controlling section 27 so as to be thermally treated in an atmosphere at 200° C. such that the insulating sprayed layer 25 should contact the brazing member thereon and the power supplying terminal 24 should be disposed through the through hole 30; thus, the base body 22 and the temperature controlling section 27 are attached together unitarily via the bonding agent layer 28. Furthermore, a silicon resin (insulating member) is filled between the power supplying terminal 24 and the through hole 30 so as to insulate therebetween; thus, a susceptor device 21 is produced.

Evaluation

Figure 3:
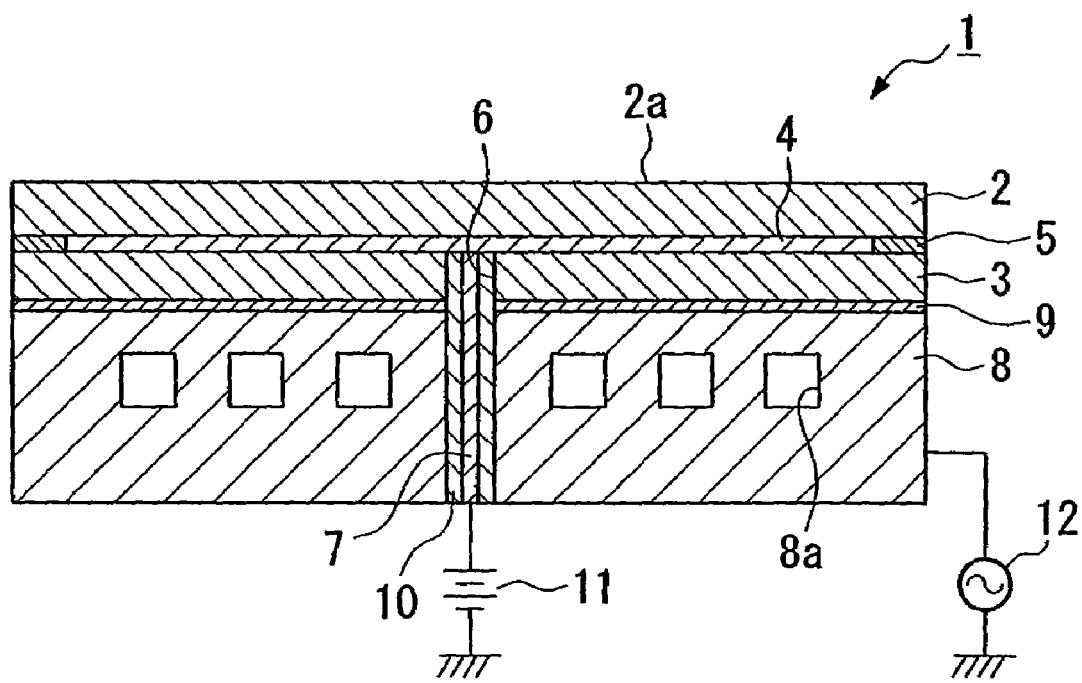
FIG. 3 is a cross section for showing an example for a conventional susceptor device.

Electrostatic absorbing characteristics in the susceptor device 21 which is produced according to the above embodiment and the susceptor device 1 (conventional example) shown in FIG. 3 are evaluated.

Silicon wafers (plate sample) having 200 mm diameter are mounted on a mounting surface of the susceptor device according to the present embodiment and the mounting surface of the conventional susceptor device respectively. In these susceptor devices, direct currents having 500V, 750V, and 1000V are respectively charged to the electrostatic absorbing inner electrode while circulating a water (cooling medium) through the flow path in the temperature controlling section so as to absorb the silicon wafers on the mounting surfaces electrostatically such that surface temperature of the silicon should be 400° C. under a plasma atmosphere which contains argon (Ar) gas.

As a result, it is possible to absorb the silicon wafer electrostatically by any of the above direct currents in the susceptor device according to the present embodiments without any inconvenience. In contrast, in the conventional susceptor device, an electric discharge occurs in the bonding agent layer when direct current of 1000V is charged. Accordingly, the safety device starts; therefore, it is not possible to absorb the silicon wafer electrostatically.

Also, the plasma does not disappear in a case in which the plasma processing operations are performed on the silicon wafer a thousand times in the susceptor device of the present embodiments; thus, the plasma is preferably stable.

The electrostatic absorbing characteristics in the susceptor device according to the present embodiments is shown in TABLE 1 below.

TABLE 1

| Charged Voltage (V) | Current Value (mA) | Electrostatic Absorbing Force (kPa) |
|---|---|---|
| 500 | 0.02 | 7 |
| 750 | 0.05 | 9 |
| 1000 | 0.15 | 11 |

What is claimed is:

1. A susceptor device comprising:
a ceramic base body having a first main surface which serves for mounting a plate sample thereon; and a second main surface;
an inner electrode which is disposed on the second main surface of the ceramic base body;
an electricity supplying terminal which is connected to the inner electrode electrically;
an insulating sprayed layer, formed by a sprayed ceramic, which covers the inner electrode, a connecting section of the inner electrode and the electricity supplying terminal; the
insulating sprayed layer having a thickness in a range of 20 µm to 500 µm;
a temperature controlling section which is disposed beneath the insulating sprayed layer and has flow paths inside of the temperature controlling section for circulating a medium for controlling the temperature of the medium,
a convex fitting section disposed on a peripheral section on either one of the ceramic base body or the temperature controlling section; and
a concave fitting section disposed on a peripheral section of the ceramic base body or the temperature controlling section so that the convex fitting section and the concave fitting section engage together to completely cover the insulating sprayed layer and a bonding agent layer such that the insulating sprayed layer and the bonding agent layer are protected from external damage, wherein
the insulating sprayed layer and the temperature controlling section are attached via the bonding agent layer;
the ceramic base body and the temperature controlling section are formed unitarily.

2. A susceptor device according to claim 1 wherein the thickness of the inner electrode is in a range of 5 µm to 200 µm.

3. A susceptor device according to claim 1, wherein the sprayed ceramic is formed by a plasma-jet spray method.

4. A susceptor device according to claim 1, wherein the insulating sprayed layer is formed of one material selected from the group consisting of alumina, silicon dioxide, silicon nitride, and silicon carbide.

5. The susceptor device of claim 1, wherein the first main surface of the ceramic base body is seamless.

6. A susceptor device according to claim 1, wherein the main surface is uniform.

7. A susceptor device comprising:
a ceramic base body having a first main surface which serves for mounting a plate sample thereon, the first main surface being seamless, and a second main surface;
an inner electrode which is disposed on the second main surface of the ceramic base body;
an electricity supplying terminal which is connected to the inner electrode electrically;
an insulating sprayed layer, formed by a sprayed ceramic, which covers the inner electrode, a connecting section of the inner electrode and the electricity supplying terminal; the insulating sprayed layer having a thickness in a range of 20 µm to 500 µm;
a temperature controlling section which is disposed beneath the insulating sprayed layer and has flow paths inside of the temperature controlling section for circulating a medium for controlling the temperature of the medium,
a convex fitting section disposed on a peripheral section on either one of the ceramic base body or the temperature controlling section; and
a concave fitting section disposed on a peripheral section of the ceramic base body or the temperature controlling section so that the convex fitting section and the concave fitting section engage together to completely cover the insulating sprayed layer and a bonding agent layer such that the insulating sprayed layer and the bonding agent layer are protected from external damage, wherein
the insulating sprayed layer and the temperature controlling section are attached via the bonding agent layer;
the ceramic base body and the temperature controlling section are formed unitarily.

* * * * *